United States Patent
Oh et al.

(10) Patent No.: US 10,442,034 B2
(45) Date of Patent: Oct. 15, 2019

(54) WAFER CUTTING APPARATUS

(71) Applicant: SAMSUNG ELECTRONICS CO., LTD., Suwon-si, Gyeonggi-do (KR)

(72) Inventors: Kyoung Whan Oh, Hwaseong-si (KR); Yeon Woo Choi, Suwon-si (KR); In Hwan Kim, Hwaseong-si (KR); Won Ki Park, Seoul (KR); Ho Youl Lee, Suwon-si (KR); Yong Won Choi, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 321 days.

(21) Appl. No.: 15/281,578

(22) Filed: Sep. 30, 2016

(65) Prior Publication Data
US 2017/0209960 A1 Jul. 27, 2017

(30) Foreign Application Priority Data
Jan. 21, 2016 (KR) .................. 10-2016-0007363

(51) Int. Cl.
| | |
|---|---|
| *B23K 26/08* | (2014.01) |
| *B23K 26/402* | (2014.01) |
| *B23K 26/03* | (2006.01) |
| *B23K 26/38* | (2014.01) |
| *H01L 21/67* | (2006.01) |
| *H01L 21/78* | (2006.01) |
| *B23K 103/00* | (2006.01) |
| *B23K 101/40* | (2006.01) |

(52) U.S. Cl.
CPC .......... *B23K 26/0876* (2013.01); *B23K 26/03* (2013.01); *B23K 26/032* (2013.01); *B23K 26/38* (2013.01); *B23K 26/402* (2013.01); *H01L 21/67092* (2013.01); *H01L 21/67259* (2013.01); *H01L 21/78* (2013.01); *B23K 2101/40* (2018.08); *B23K 2103/56* (2018.08)

(58) Field of Classification Search
CPC ........ H01L 21/67092; H01L 21/67259; B23K 26/0876; B23K 26/032; B23K 26/402; B23K 26/38; B23K 26/03
USPC .................. 219/121.67, 121.78; 264/400
See application file for complete search history.

(56) References Cited

U.S. PATENT DOCUMENTS

| | | |
|---|---|---|
| 5,917,733 A | 6/1999 | Bangham |
| 5,955,998 A | 9/1999 | Roberts et al. |
| 6,229,114 B1 | 5/2001 | Andrews et al. |
| 6,317,170 B1 | 11/2001 | Hwang et al. |
| 6,388,231 B1 | 5/2002 | Andrews |
| 6,827,723 B2 | 12/2004 | Carson |
| 6,923,817 B2 | 8/2005 | Carson et al. |
| 7,027,383 B2 | 4/2006 | Van Woudenberg |
| 7,116,437 B2 | 10/2006 | Weinstein et al. |
| 7,138,254 B2 | 11/2006 | Jovanovich et al. |

(Continued)

*Primary Examiner* — Nahida Sultana
(74) *Attorney, Agent, or Firm* — Lee & Morse, P.C.

(57) ABSTRACT

A wafer cutting apparatus includes a stage to support a wafer, a cutter, and a sensor. The cutter irradiates the wafer with a beam in a first direction to cut the wafer. The sensor is spaced apart from the cutter in a second direction different from the first direction, and measures a spaced distance between the wafer and the cutter. The sensor measures the spaced distance between the wafer and the cutter along a second cutting line parallel to a first cutting line while the cutter cuts the wafer along the first cutting line on the wafer.

15 Claims, 14 Drawing Sheets

(56) References Cited

U.S. PATENT DOCUMENTS

| | | |
|---|---|---|
| 7,157,038 B2 | 1/2007 | Baird et al. |
| 7,238,912 B2 | 7/2007 | Sopori |
| 7,447,556 B2 | 11/2008 | McBagonluri et al. |
| 7,598,898 B1 | 10/2009 | Funk et al. |
| 7,613,539 B2 | 11/2009 | Bae et al. |
| 7,840,300 B2 | 11/2010 | Harker |
| 8,462,331 B2 | 6/2013 | Ryu et al. |
| 8,488,106 B2 | 7/2013 | Shibazaki et al. |
| 8,492,676 B2 | 7/2013 | Azuma et al. |
| 8,624,153 B2 | 1/2014 | Atsumi et al. |
| 8,993,922 B2 * | 3/2015 | Atsumi ............... B23K 26/046 219/121.67 |
| 2006/0092990 A1 * | 5/2006 | Koga .................... B23K 26/04 372/7 |
| 2006/0119691 A1 * | 6/2006 | Shigematsu ....... B23K 26/0853 347/131 |
| 2008/0318395 A1 * | 12/2008 | Farnworth ........... B28D 5/0064 438/462 |
| 2009/0266802 A1 * | 10/2009 | Sawabe ............... B23K 26/046 219/121.67 |
| 2010/0044358 A1 * | 2/2010 | Furuta ................. B23K 26/046 219/121.72 |
| 2010/0044359 A1 * | 2/2010 | Sawabe ................ B23K 26/03 219/121.83 |
| 2012/0056309 A1 * | 3/2012 | Kim .................. H01L 21/67092 257/620 |
| 2013/0291593 A1 * | 11/2013 | Roh .................... G01N 21/958 65/29.12 |
| 2014/0144895 A1 * | 5/2014 | Stork Genannt Wersborg ............ B23K 26/046 219/121.75 |
| 2014/0175071 A1 * | 6/2014 | Pfitzner ............... B23K 26/032 219/121.81 |
| 2016/0158884 A1 * | 6/2016 | Hagenlocher ...... B23K 26/0884 219/121.85 |
| 2016/0193707 A1 * | 7/2016 | Widmann .......... B23Q 11/0875 219/121.78 |
| 2016/0207144 A1 * | 7/2016 | Narita ................ B23K 26/0617 |
| 2016/0288267 A1 * | 10/2016 | Gesuita ................ B23K 26/046 |
| 2017/0021451 A1 * | 1/2017 | Drexler ................ B23K 26/034 |
| 2017/0157711 A1 * | 6/2017 | Spiess ................... B23K 26/03 |
| 2018/0147659 A1 * | 5/2018 | Shapiro ................ B23K 26/042 |
| 2018/0243862 A1 * | 8/2018 | Yang .................... B23K 26/38 |
| 2019/0155248 A9 * | 5/2019 | Shapiro ................ G05B 19/406 |

* cited by examiner

WAFER CUTTING APPARATUS

CROSS-REFERENCE TO RELATED APPLICATION

Korean Patent Application No. 10-2016-0007363, filed on Jan. 21, 2016, and entitled "Wafer Cutting Apparatus," is incorporated by reference herein in its entirety.

BACKGROUND

1. Field

One or more embodiments described herein relate to a wafer cutting apparatus.

2. Description of the Related Art

Various cutting processes have been developed to divide wafers into semiconductor chips. One process uses a diamond blade to saw wafers. This process generates wafer particles that may adversely affect chip performance. Cleaning the wafer is also an issue. Also, truncating water is required to be injected during blade sawing in order to reduce temperature. All of these increase costs and processing time.

Another process uses a laser to cut wafers. During this process (known as stealth cutting), the position of a focal point of the laser is aligned with the middle of the wafer. This process has several drawbacks. For example, punching height is a concern. Also, some chips may not be completely divided when cut from the top. When cut from the bottom, thermal damage may result that impairs proper operation of the divided chips.

SUMMARY

In accordance with one or more embodiments, a wafer cutting apparatus includes a stage to support a wafer; a cutter to supply the wafer with a beam in a first direction to cut the wafer; and a sensor spaced apart from the cutter in a second direction different from the first direction, the sensor to measure a spaced distance between the wafer and the cutter, wherein the sensor is to measure the spaced distance between the wafer and the cutter along a second cutting line parallel to a first cutting line while the cutter cuts the wafer along the first cutting line on the wafer.

In accordance with one or more other embodiments, a wafer cutting apparatus includes a stage to support a wafer; a cutter to irradiate the wafer with a beam along a first direction to cut the wafer; a first sensor on a first side of the cutter to measure a first spaced distance between the wafer and the cutter; and a second sensor, on a second side opposing the first side of the cutter, to measure a second spaced distance between the wafer and the cutter, wherein the cutter, the first sensor, and the second sensor are disposed along the first direction and wherein at least one of the first or second sensors are to operate while the cutter cuts the wafer.

In accordance with one or more other embodiments, an apparatus includes a cutter to cut a wafer with a beam in a first direction; and a sensor spaced from the cutter in a second direction different from the first direction, wherein the cutter is to cut the wafer at a same time the sensor is to measure a distance between the wafer and the cutter.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
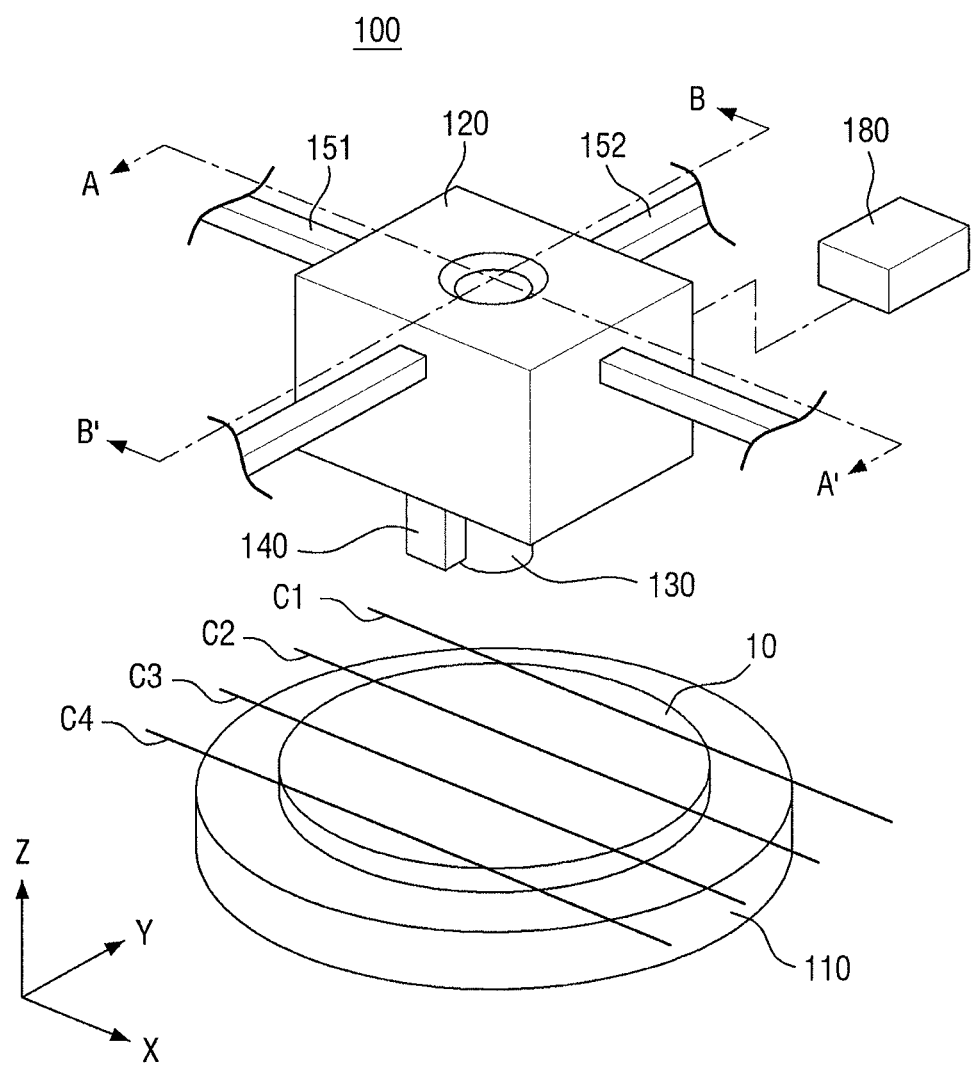
FIG. 1 illustrates an embodiment of a wafer cutting apparatus.
Figure 2:
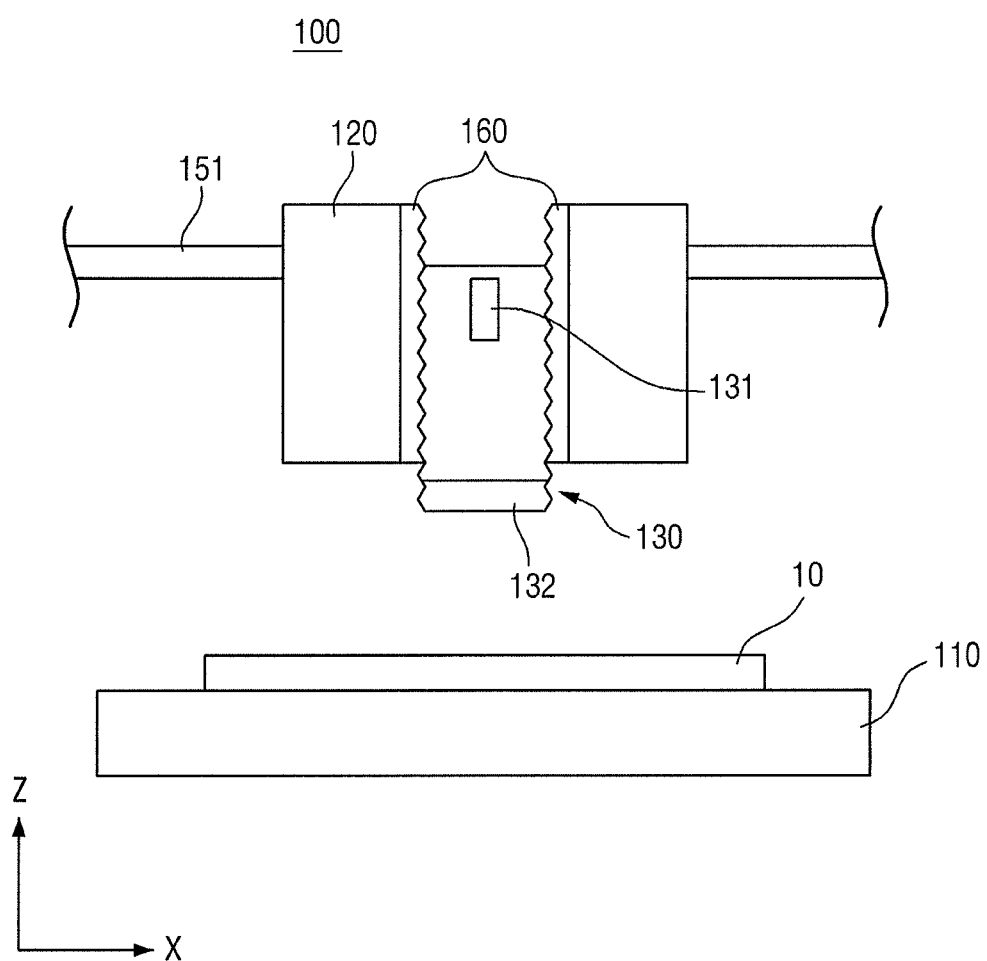
FIG. 2 illustrates a view along section line A-A' in FIG. 1.
Figure 3:
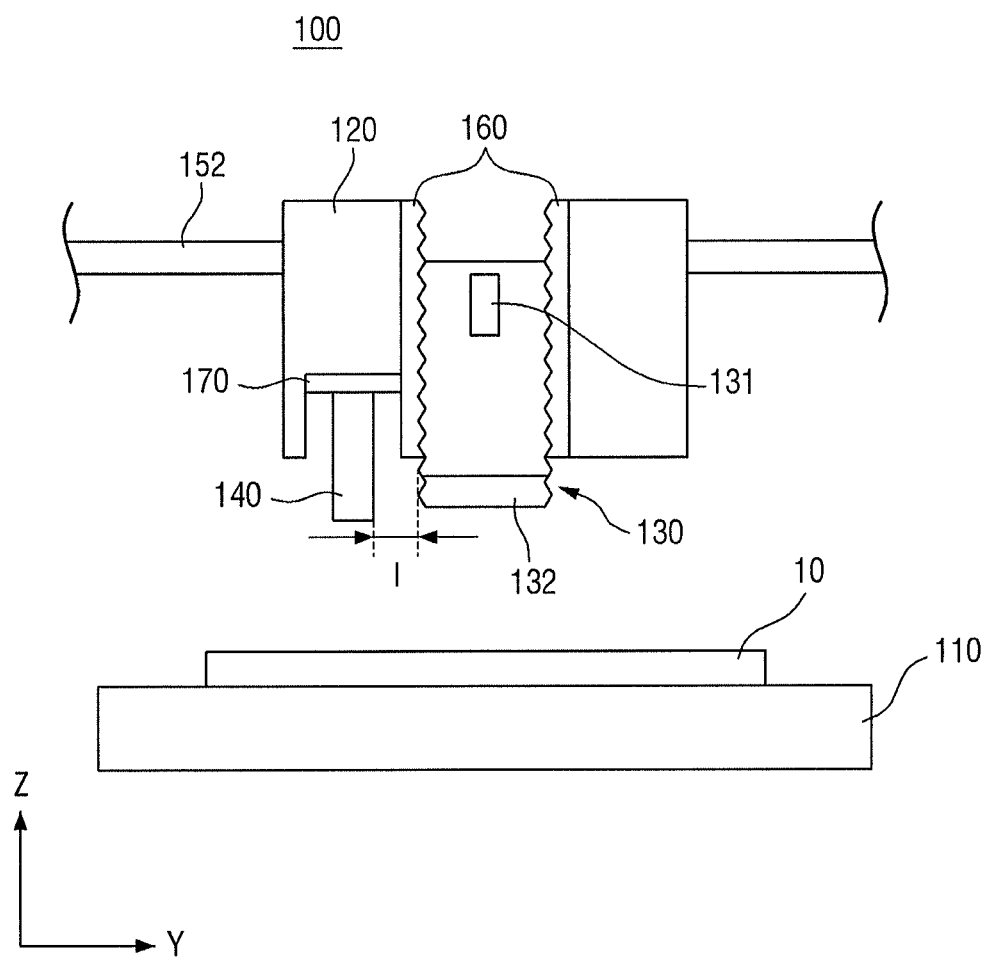
FIG. 3 illustrates a view along section line B-B' in FIG. 1.

FIG. 1 illustrates an embodiment of a wafer cutting apparatus 100. FIG. 2 is a cross-sectional view taken along line A-A' in FIG. 1. FIG. 3 is a cross-sectional view taken along line B-B' in FIG. 1.

Referring to FIGS. 1 through 3, the wafer cutting apparatus 100 includes a stage 110, a body 120, a laser cutter 130, a sensor 140, a first transfer unit 151, a second transfer unit 152, a third transfer unit 160, an adjusting unit 170, and a calculating unit 180. The stage 110 may be below the laser cutter 130 and the sensor 140 and may support a wafer 10 on the stage 110. The stage 110 may rotate in a horizontal plane to rotate the wafer 10.

The body 120 may include the laser cutter 130, the sensor 140, the third transfer unit 160, and the adjusting unit 170 therein. The body 120 may protect the laser cutter 130, the sensor 140, the third transfer unit 160, and the adjusting unit 170. Further, the body 120 may be connected to the first transfer unit 151 and the second transfer unit 152 and may move in a first direction X or a second direction Y.

The laser cutter 130 may include a light source 131 and a lens 132. The laser cutter 130 may produce a beam that penetrates through the body 120 in a third direction Z perpendicular to a horizontal plane in which the wafer 10 is disposed. In other embodiments, the laser cutter 130 may be inserted into a groove in the body 120. In other embodiments, the laser cutter 130 may be on a side surface of the body 120.

The laser cutter 130 may cut the wafer 10 by irradiating a laser beam onto the wafer 10. The laser cutter 130 may adjust the cutting depth of the wafer 10, for example, by moving in the third direction Z through holes inside the body 120.

The light source 131 may be inside or on the laser cutter 130. The light source 131 may generate a laser beam which passes through the lens 132. In other embodiments, the light source 131 may be another type of beam that is capable of cutting the wafer 10.

The lens 132 may be inside the laser cutter 130. Although a single lens is illustrated inside the laser cutter 130 in FIGS. 2 and 3, the laser cutter 130 may include two or more lenses 132 in other embodiments. In this case, a plurality of lenses 132 may be spaced apart from one another in the third direction Z. The lens 132 may focus the laser beam emitted from the light source 131 on a certain area on the wafer 10, to thereby cut the wafer 10 at that area.

The third transfer units 160 may be on the side walls of the holes that penetrate through the body 120. For example, the third transfer units 160 are on the side walls of the hole penetrating through the body 120 and may be in contact with the side surfaces of the laser cutter 130.

The third transfer units 160 may adjust the spaced distance between the laser cutter 130 and the wafer 10, for example, by moving the laser cutter 130 in the third direction Z. Thus, the third transfer unit 160 may adjust the depth of cut of the wafer 10 based on the laser beam irradiated from the laser cutter 130.

The third transfer unit 160 may not be connected to the sensor 140. For example, the third transfer unit 160 may be involved only in the movement of the laser cutter 130 in the third direction Z, and may not be involved in the movement of the sensor 140 in the third direction Z. Thus, the laser cutter 130 may move in the third direction Z independently from the sensor 140.

The third transfer unit 160 may fix the position of the sensor 140 in the third direction Z by moving the laser cutter 130 independently from the sensor 140. The position of the sensor 140 in the third direction Z may be fixed when correcting the spaced distance of the laser cutter 130 that occurs due to changes in spaced distance between the laser cutter 130 and the wafer 10. In other embodiments, the third transfer unit 160 may be simultaneously involved in the movement of the sensor 140 and the laser cutter 130 in the third direction Z.

The sensor 140 may be inserted into the grooves below the body 120. In other embodiments, the sensor 140 may penetrate through the body 120 in the third direction Z. In other embodiments, the sensor 140 may be on the side surface of the body 120. A single sensor 140 is illustrated as being in or on the body 120 in FIGS. 1 to 3. In other embodiments, two or more sensors 140 may be in or on the body 120.

The sensor 140 may irradiate the wafer 10 with the beam to measure the spaced distance between the sensor 140 and the wafer 10. For example, the sensor 140 may irradiated the wafer 10 below the sensor 140 with the beam, and may measure the spaced distance between the sensor 140 and the wafer 10 by receiving the beam reflected from the wafer 10. The sensor 140 may measure the spaced distance between the laser cutter 130 and the wafer 10 based on the measured spaced distance between the sensor 140 and the wafer 10.

The sensor 140 may be spaced apart from the laser cutter 130 in a direction different from the first direction X in which the laser cutter 130 cuts the wafer. For example, the sensor 140 may be spaced apart from the laser cutter 130 in a second direction Y perpendicular to the first direction X. In other embodiments, the sensor 140 may be spaced apart from the laser cutter 130 in a direction different from the first direction X and the second direction Y.

An interval 1 in the second direction Y between the sensor 140 and the laser cutter 130 may be the same as an interval between respectively adjacent cutting lines formed on the wafer 10.

The adjusting unit 170 may be on the sensor 140 inside the body 120. In other embodiments, the adjusting unit 170 may be on the side surface of the sensor 140. The adjusting unit 170 may adjust the interval 1 between the laser cutter 130 and the sensor 140. For example, the adjusting unit 170 may adjust the interval 1 between the laser cutter 130 and the sensor 140 by moving the sensor 140 in the second direction Y. The adjusting unit 170 may adjust the interval between the cutting lines, by adjusting the interval 1 between the sensor 140 and the laser cutter 130. Various sizes of the semiconductor chips may be manufactured accordingly.

The first transfer units 151 may be on respective sides of the body 120. For example, the first transfer units 151 may be on respective sides of the body 120 to extend in the first direction X. The first transfer units 151 may be on other sides of the body 120 in other embodiments.

The first transfer unit 151 may move the body 120 in the first direction X that is a direction in which the wafer 10 is cut. The laser cutter 130 may cut the wafer 10 along a cutting line formed on the wafer 10 by operation of the first transfer unit 151.

Further, the sensor 140 may measure the spaced distance between the laser cutter 130 and the wafer 10 along the cutting line formed on the wafer 10 by operation of the first transfer unit 151.

The second transfer units 152 may be on respective sides of the body 120. For example, the second transfer units 152 may be on respective sides of the body 120 to extend in the second direction Y. The second transfer units 152 may be on other sides of the body 120 in other embodiments.

The second transfer unit 152 may move the body 120 in the second direction Y perpendicular to the first direction X that is a direction in which the wafer 10 is cut. The laser cutter 130 and the sensor 140 may move between the respective cutting lines formed on the wafer 10 by operation of the second transfer unit 152.

The calculating unit 180 may be outside or inside the body 120. The calculating unit 180 may calculate the positions of each cutting line on the wafer 10, for example, using interpolation and extrapolation techniques. The calculating unit 180 may therefore adjust the interval between the respective cutting lines.

The calculating unit 180 may be electrically connected to the adjusting unit 170 to adjust the interval 1 between the laser cutter 130 and the sensor 140. As a result, the calculating unit 180 may adjust the interval 1 between the laser cutter 130 and sensor 140 to correspond to the intervals between the respective calculated cutting lines.

Figure 4:
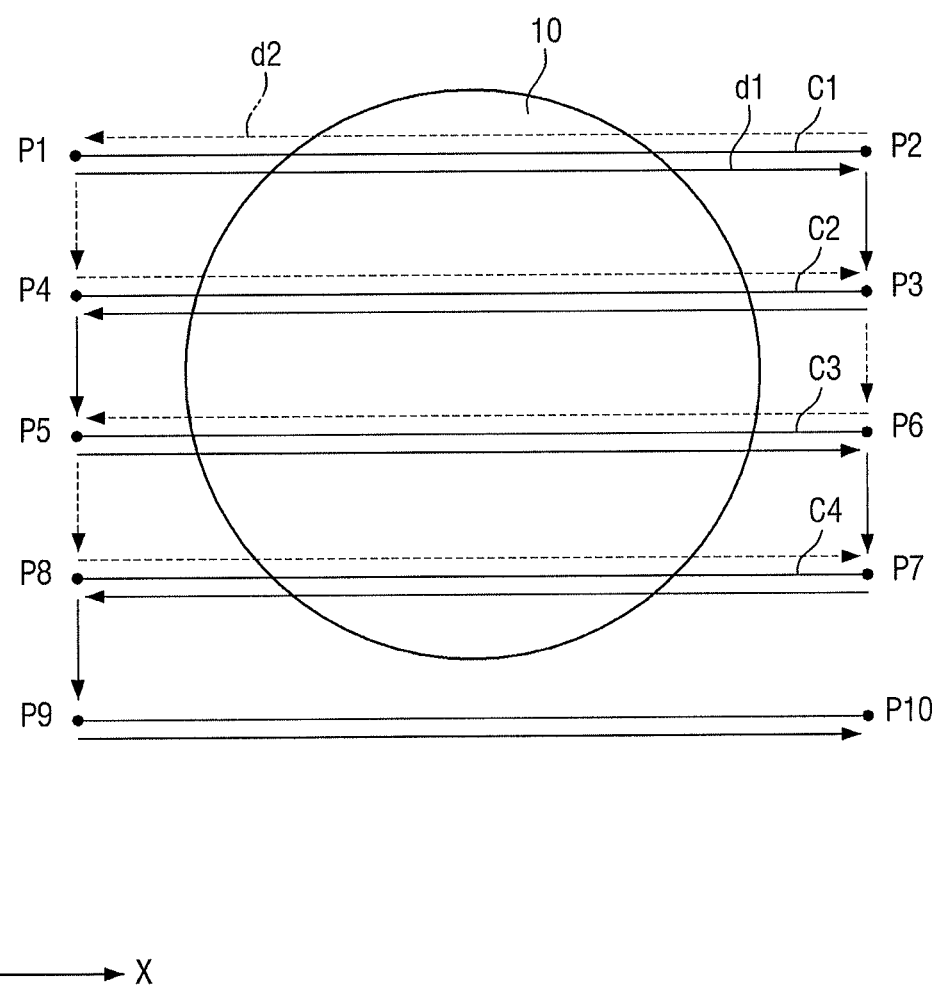
FIG. 4 illustrates an embodiment of a wafer cutting operation.
Figure 5:
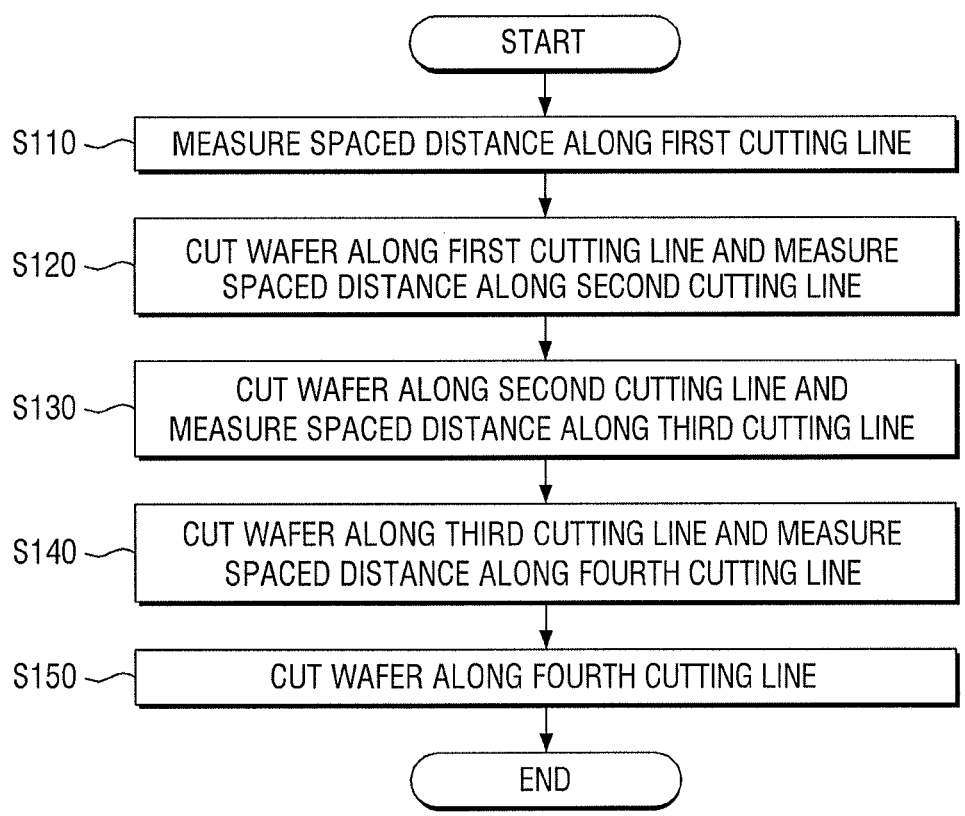
FIG. 5 illustrates an embodiment of a method for wafer cutting.

FIG. 4 illustrates an operation of the wafer cutting apparatus according to one embodiment. FIG. 5 illustrates an embodiment of a method for performing wafer cutting using the wafer cutting apparatus.

Referring to FIGS. 1, 4, and 5, four cutting lines may be formed on the wafer 10: a first cutting line C1, a second cutting line C2, a third cutting line C3, and a fourth cutting line C4. In other embodiments, a different number of cutting lines may be formed on the wafer 10.

The cutting lines C1, C2, C3, and C4 may be parallel to one another in the first direction X in which the wafer 10 is cut. The intervals between adjacent pairs of the cutting lines C1, C2, C3, and C4 may be the same. The intervals between the respective cutting lines C1, C2, C3, and C4 may be the same as the width of the semiconductor chip in the second direction Y formed by cutting the wafer 10.

FIG. 4 illustrates a traveling route d1 of the sensor 140 and a traveling route d2 of the laser cutter 130 when the wafer cutting apparatus 100 cuts the wafer 10.

The sensor 140 may measure the spaced distance between the laser cutter 130 and the wafer 10 along a first cutting line C1 from the first position P1 to the second position P2, by operation of the first transfer unit 151 (S110). The laser cutter 130 spaced apart from the sensor 140 in the second direction Y is not on the wafer 10.

After the spaced distance between the laser cutter 130 and the wafer 10 on the first cutting line C1 is measured by the sensor 140, the sensor 140 may be moved to a third position P3 from the second position P2, by operation of the second transfer unit 152. The laser cutter 130 may be at the second position P2 by operation of the second transfer unit 152.

Subsequently, the sensor 140 may measure the spaced distance between the laser cutter 130 and the wafer 10 from the third position P3 to the fourth position P4 along the second cutting line C2 by the operation of the first transfer unit 151.

The laser cutter 130 may cut the wafer 10 from the second position P2 to the first position P1 along the first cutting line C1, by operation of the first transfer unit 151, based on the measured spaced distance between the laser cutter 130 and the wafer 10 on the first cutting line C1 (S120).

Subsequently, the sensor 140 may be moved from the fourth position P4 to a fifth position P5 by operation of the second transfer unit 152. The laser cutter 130 may be moved from the first position P1 to the fourth position P4 by operation of the second transfer unit 152.

Subsequently, the sensor 140 may measure the spaced distance between the laser cutter 130 and the wafer 10 from the fifth position P5 to a sixth position P6 along the third cutting line C3 by operation of the first transfer unit 151.

The laser cutter 130 may cut the wafer 10 from the fourth position P4 to the third position P3 along the second cutting line C2, by operation of the first transfer unit 151, based on the measured spaced distance between the laser cutter 130 and the wafer 10 on the second cutting line C2 (S130).

Subsequently, the sensor 140 may be moved from the sixth position P6 to a seventh position P7 by operation of the second transfer unit 152. The laser cutter 130 may be moved from the third position P3 to the sixth position P6 by operation of the second transfer unit 152.

Subsequently, the sensor 140 may measure the spaced distance between the laser cutter 130 and the wafer 10 from the seventh position P7 to an eighth position P8 along the fourth cutting line C4 by operation of the first transfer unit 151.

The laser cutter 130 may cut the wafer 10 from the sixth position P6 to the fifth position P5 along the third cutting line C3, by operation of the first transfer unit 151, based on the measured spaced distance between the laser cutter 130 and the wafer 10 on the third cutting line C3 (S140).

Subsequently, the sensor 140 may be moved to a ninth position P9 from the eighth position P8 by operation of the second transfer unit 152. The laser cutter 130 may be moved from the fifth position P5 to the eighth position P8 by operation of the second transfer unit 152.

Subsequently, the sensor 140 may be moved from the ninth position P9 to a tenth position P10 by the operation of the first transfer unit 151.

The laser cutter 130 may cut the wafer 10 from the eighth position P8 to the seventh position P7 along the fourth cutting line C4, by operation of the first transfer unit 151, based on the measured spaced distance between the laser cutter 130 and the wafer 10 on the fourth cutting line C4 (S150). The measurement of the spaced distance between the laser cutter 130 and the wafer 10 and the cutting of the wafer 10 may be simultaneously performed on the wafer 10 by operation of wafer cutting apparatus 100.

Figure 6:
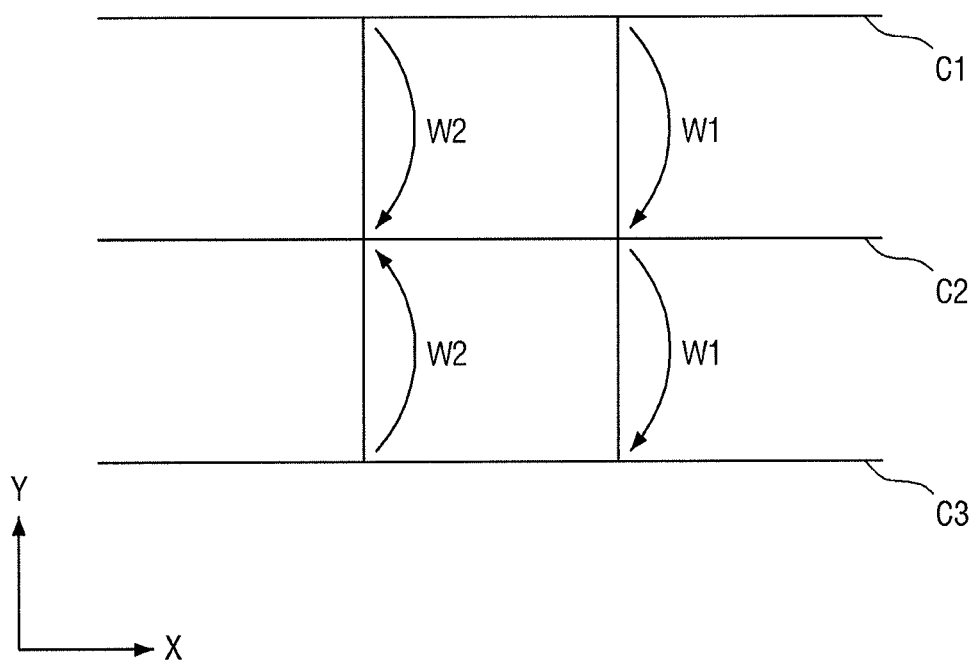
FIG. 6 illustrates an embodiment for acquiring a cutting line position.

FIG. 6 illustrates an embodiment for position acquisition of the cutting line in the wafer cutting apparatus. Referring to FIGS. 1 and 6, the wafer cutting apparatus 100 may calculate the intervals between each of the cutting lines C1, C2, C3, and C4, using the calculating unit 180. The wafer cutting apparatus 100 may therefore manufacture semiconductor chips of various sizes.

The calculating unit 180 may calculate the intervals between each of the cutting lines C1, C2, C3, and C4, for example, using interpolation and/or extrapolation techniques. Although the form of a function f(x) of a real variable x is unknown, when function values $f(x_i)$ of values $x_i$ (i=1, 2, ..., n) of two or more variables having some intervals (irrespective of equidistance or non-equidistance) are known, interpolation may include estimation of the function value of any x between the values.

When using interpolation, it is possible to calculate the position of the second cutting line C2, formed between the first cutting line C1 and the third cutting line C3, based on the interval between the first cutting line C1 and the third cutting line C3.

For example, since the respective cutting lines formed on the wafer 10 in the wafer cutting apparatus 100 are spaced apart from one another at the same intervals, it is possible to calculate the position of the second cutting line C2, which is spaced apart from each of the first cutting line C1 and the third cutting line C3 between the first cutting line C1 and the third cutting line C3 at the same interval W2.

Extrapolation may involve the estimation of the first function value that is not illustrated in the data, such as a certain graph, using a second function value adjacent to the first function value. When using the extrapolation, it is possible to calculate the position of the third cutting line C3 formed adjacent to the second cutting line C2, based on the interval W1 between the first cutting line C1 and second cutting line C2.

For example, because the respective cutting lines formed on the wafer 10 in the wafer cutting apparatus 100 are spaced apart from one another at the same intervals, it is possible to calculate the position of the third cutting line C3, that is spaced apart from the second cutting line C2 in the second direction Y at the same interval as the interval W1 between the first cutting line C1 and the second cutting line C2.

In some embodiments, the calculating unit 180 may calculate the position of each cutting line simultaneously using the interpolation and extrapolation techniques. For example, the calculating unit 180 may calculate the position of each cutting line based on an average value between the position value of the cutting line calculated by interpolation and the position value of the cutting line calculated by extrapolation.

Because the wafer cutting apparatus 100 simultaneously performs measurement of the spaced distance between the laser cutter 130 and the wafer 10 and the cutting of the wafer 10, process time of the cutting process performed by the wafer 10 may be shortened in at least one embodiment. Further, since the laser cutter 130 and the sensor 140 are spaced apart from each other in the second direction Y, reliability of the cutting process of the wafer 10 may be improved by measuring the spaced distance between the laser cutter 130 and the wafer 10 along all the cutting lines on wafer 10.

Figure 7:
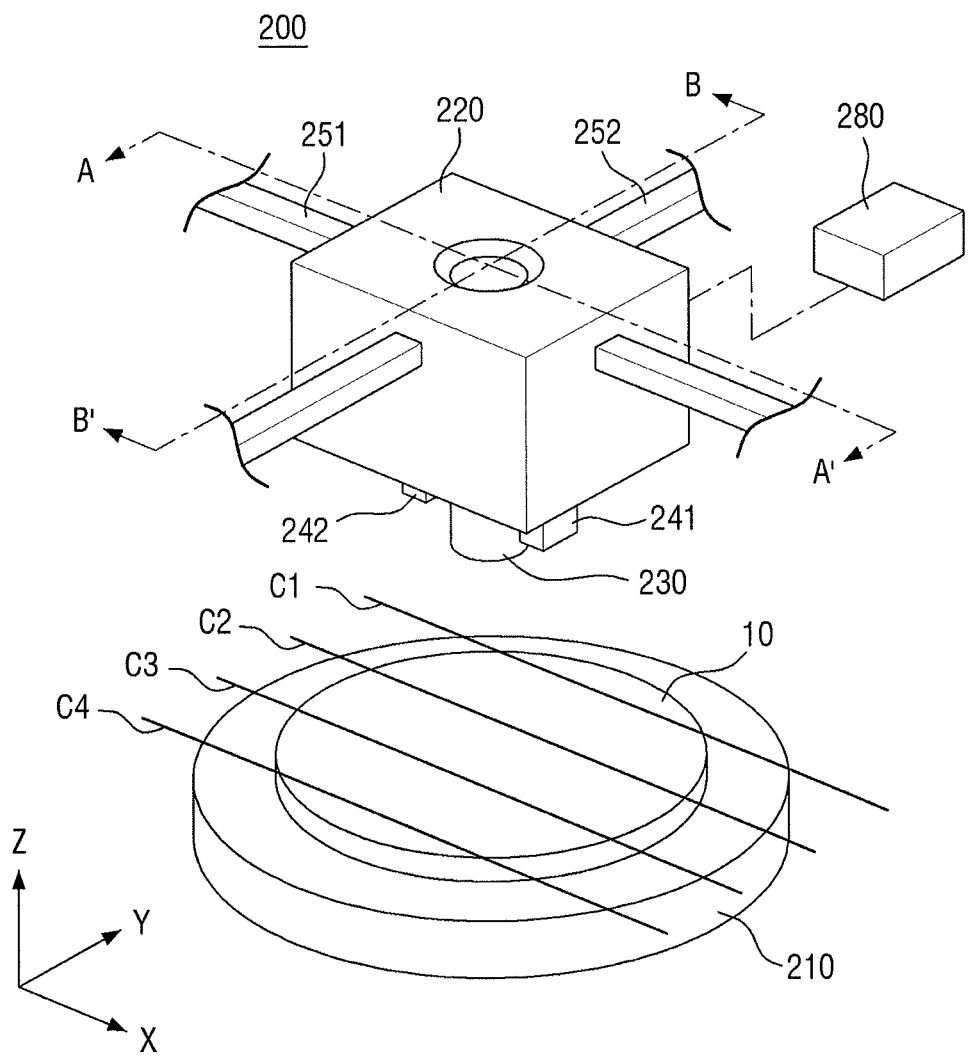
FIG. 7 illustrates another embodiment of a wafer cutting apparatus.
Figure 8:
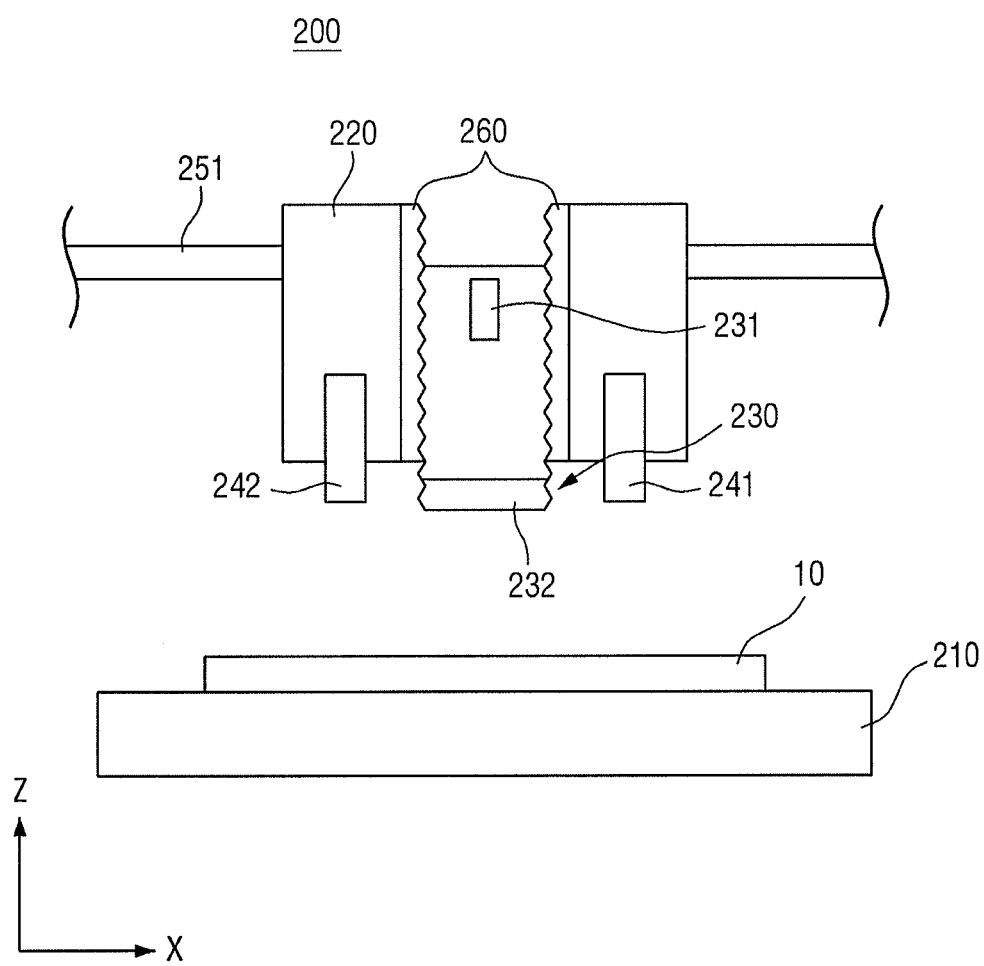
FIG. 8 illustrates a view along section line C-C' in FIG. 7.
Figure 9:
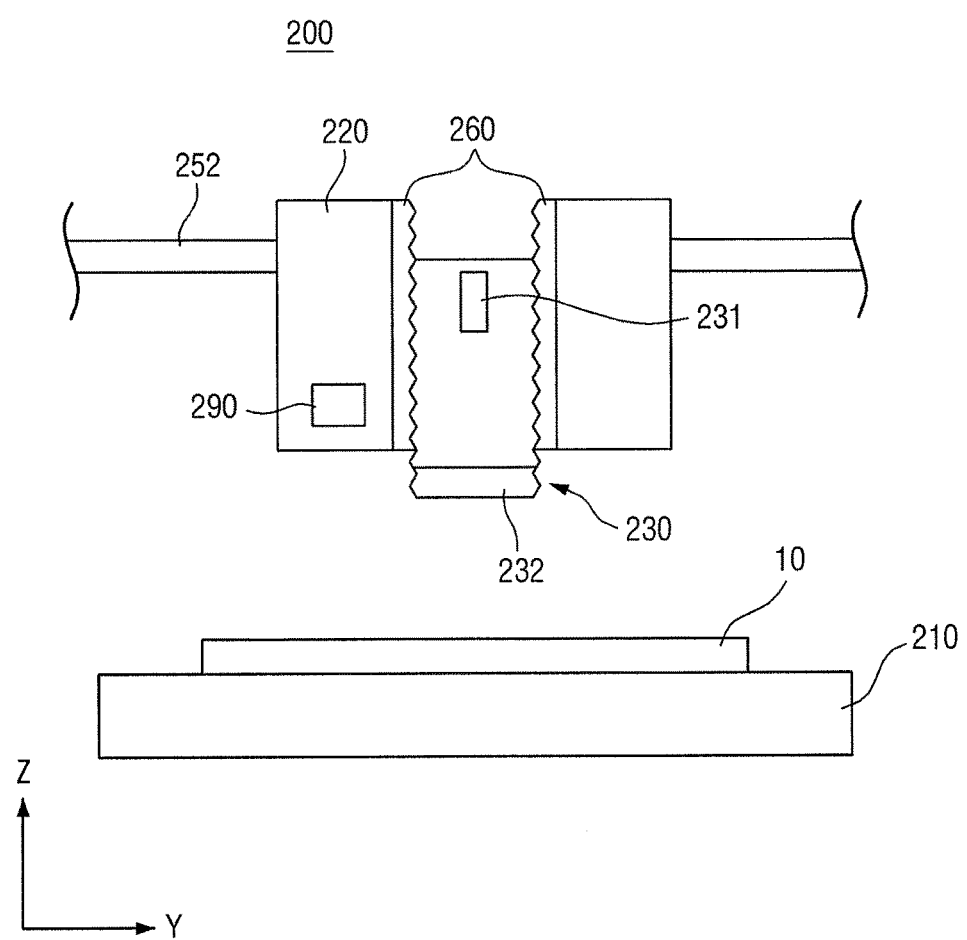
FIG. 9 illustrates a view along section line D-D' in FIG. 7.
Figure 10:
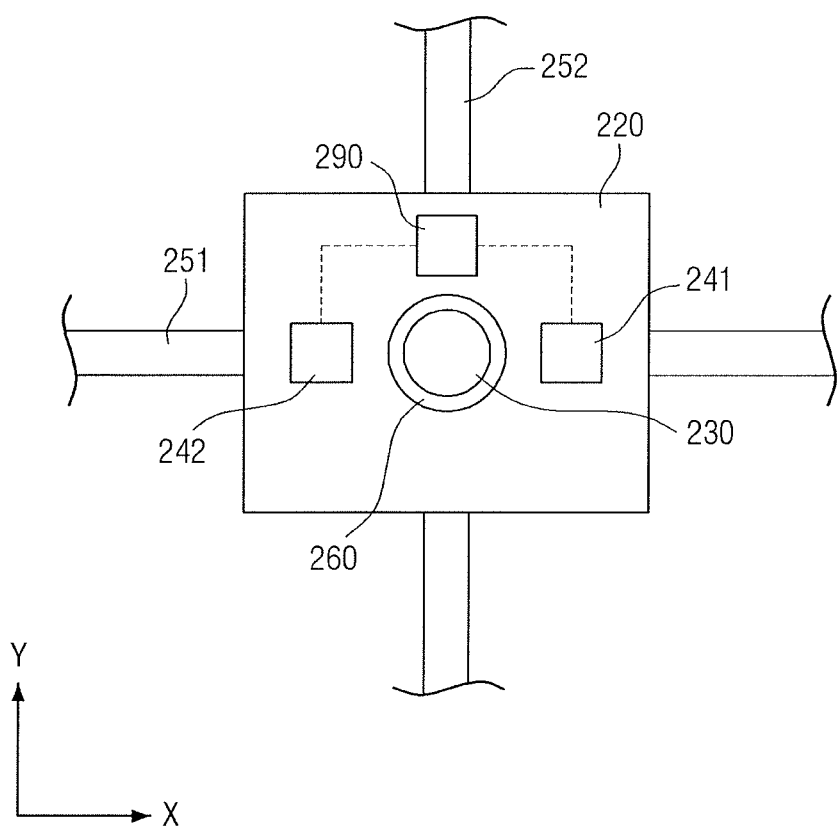
FIG. 10 illustrates an embodiment of the interior of a wafer cutting apparatus.

FIG. 7 illustrates another embodiment of a wafer cutting apparatus 200. FIG. 8 is a cross-sectional view taken along line C-C' in FIG. 7. FIG. 9 is a cross-sectional view taken along line D-D' in FIG. 7. FIG. 10 illustrates an embodiment of an interior of the wafer cutting apparatus.

Referring to FIGS. 7 through 10, a wafer cutting apparatus 200 includes a stage 210, a body 220, a laser cutter 230, a first sensor 241, a second sensor 242, a first transfer unit 251, a second transfer unit 252, a third transfer unit 260, a calculating unit 280, and a correcting unit 290. The laser cutter 230 may include a light source 231 and a lens 232.

Unlike the wafer cutting apparatus 100, in the wafer cutting apparatus 200, the first sensor 241, the laser cutter 230, and the second sensor 242 may be disposed along the first direction X that is a direction in which the wafer 10 is cut. For example, the first sensor 241 may be on a first side of the laser cutter 230 to be spaced apart in the first direction. The second sensor 242 may be on a second side of the laser cutter 230, e.g., on a second side which opposes the laser cutter 241 to be spaced apart in the first direction.

Further, unlike the wafer cutting apparatus 100, since the first sensor 241, the laser cutter 230, and the second sensor 242 are on the same line, the wafer cutting apparatus 200 does not include an adjusting unit 170 that adjusts the interval between the sensor 140 and the laser cutter 130 depending on the size of the semiconductor chip.

Further, unlike the wafer cutting apparatus 100, the wafer cutting apparatus 200 includes the correcting unit 290. The correcting unit 290 may correct an offset between the first sensor 241 and the second sensor 242, for example, by comparing a first spaced distance between the laser cutter 230 and the wafer 10 measured by the first sensor 241 with a second spaced distance between the laser cutter 230 and the wafer 10 measured by the second sensor 242. The correcting unit 290 may be disposed inside or outside the body 220.

Figure 11:
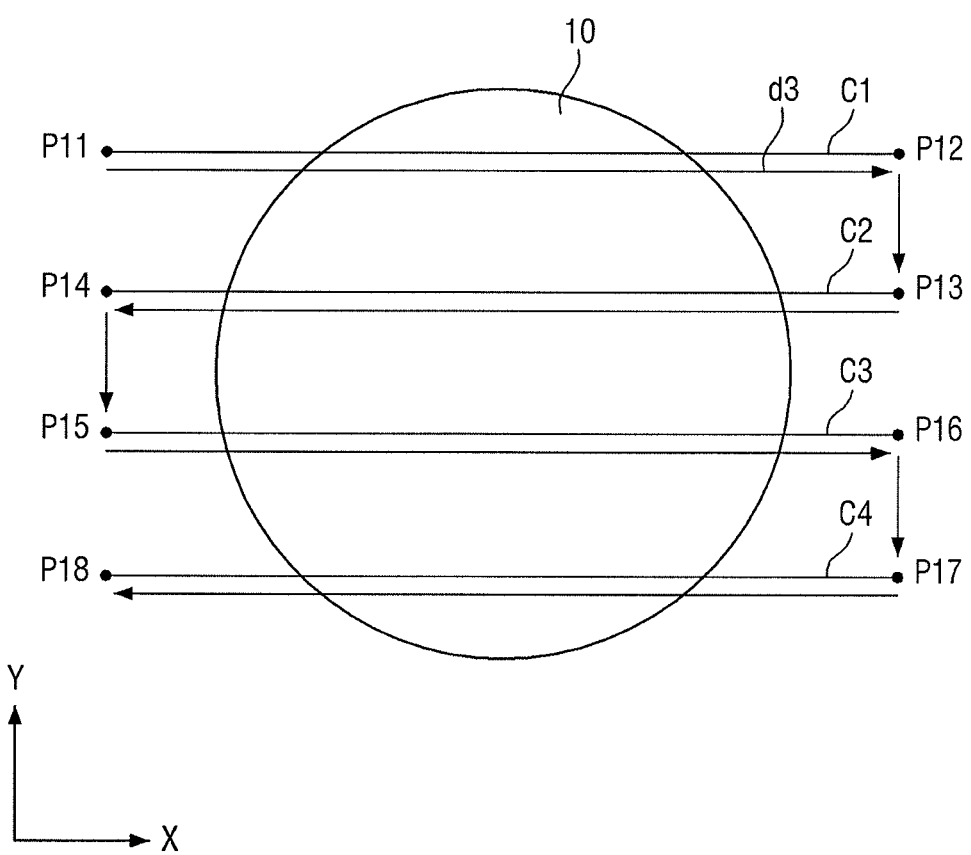
FIG. 11 illustrates another embodiment of a wafer cutting apparatus.
Figure 12:
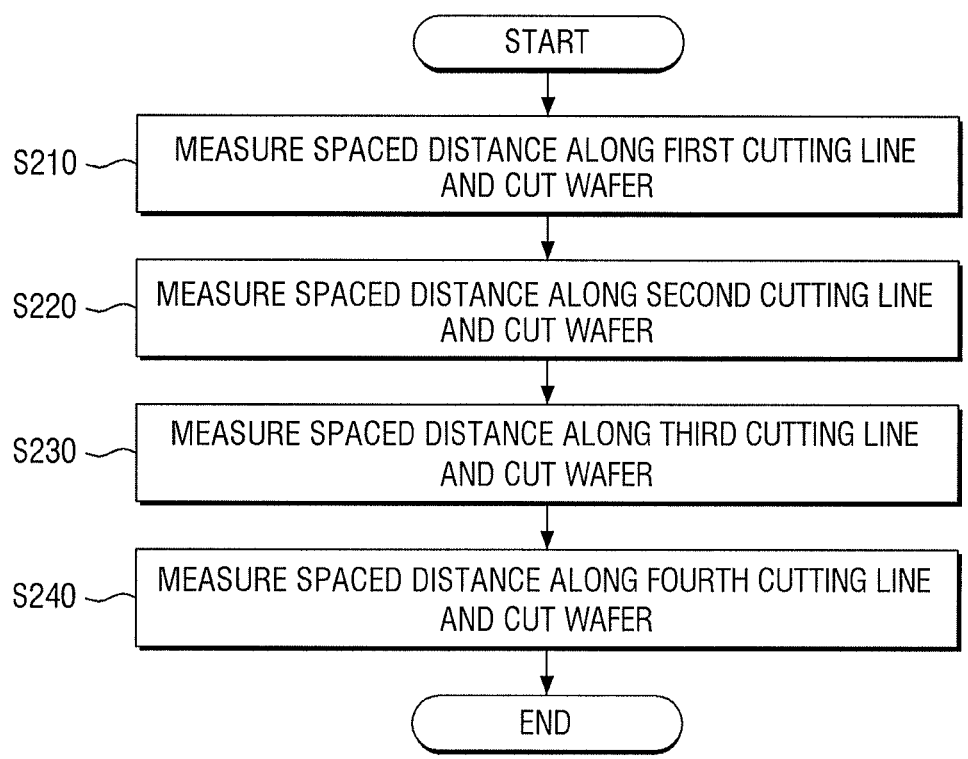
FIG. 12 illustrates another embodiment of a method for wafer cutting.

FIG. 11 illustrates an embodiment of an operation of the wafer cutting apparatus 200. FIG. 12 illustrating another embodiment of a method for wafer cutting.

Referring to FIGS. 7, 11, and 12, four cutting lines may be formed on the wafer 10: a first cutting line C1, a second cutting line C2, a third cutting line C3, and a fourth cutting line C4. A different number of cutting lines formed on the wafer 10 in other embodiments.

FIG. 11 illustrates traveling routes d3 of the first sensor 241, the laser cutter 230, and the second the sensor 242 when the wafer cutting apparatus 200 cuts the wafer 10. The first sensor 241 may measure a first spaced distance between the laser cutter 230 and the wafer 10 from an eleventh position P11 to a twelfth position P12 along the first cutting line C1 by operation of the first transfer unit 251.

The laser cutter 230 may cut the wafer 10 from the eleventh position P11 to the twelfth position P12 along the cutting line C1, by operation of the first transfer unit 251, based on the measured first spaced distance between the laser cutter 230 and the wafer 10 on the first cutting line C1 (S210).

Subsequently, the first sensor 241, the laser cutter 230, and the second sensor 242 may be moved from the twelfth position P12 to a thirteenth position P13 by operation of the second transfer unit 252.

Subsequently, the second sensor 242 may measure a second spaced distance between the laser cutter 230 and the wafer 10 from the thirteenth position P13 to the fourteenth position P14 along a second cutting line C2 by operation of the first transfer unit 251.

The laser cutter 230 may cut the wafer 10 from the thirteenth position P13 to the fourteenth position P14 along the second cutting line C2, by operation of the first transfer unit 251, based on the measured second spaced distance between the laser cutter 230 and the wafer 10 on the second cutting line C2 (S220).

Subsequently, the first sensor 241, the laser cutter 230 and the second sensor 242 may be moved from the fourteenth position P14 to a fifteenth position P15 by operation of the second transfer unit 252.

Subsequently, the first sensor 241 may measure a first spaced distance between the laser cutter 230 and the wafer 10 from the fifteenth position P15 to a sixteenth position P16 along a third cutting line C3 by operation of the first transfer unit 251.

The laser cutter 230 may cut the wafer 10 from the fifteenth position P15 to the sixteenth position P16 along the third cutting line C3, by operation of the first transfer unit 251, based on a measured first spaced distance between the laser cutter 230 and the wafer 10 on the third cutting line C3 (S230).

Subsequently, the first sensor 241, the laser cutter 230, and the second sensor 242 may be moved from the sixteenth position P16 to a seventh position P17 by operation of the second transfer unit 252.

Subsequently, the second sensor 242 may measure a second spaced distance between the laser cutter 230 and the wafer 10 from the seventh position P17 to an eighteenth position P18 along a fourth cutting line C4 by operation of the first transfer unit 251.

The laser cutter 230 may cut the wafer 10 from the seventh position P17 to the eighteenth position P18 along the fourth cutting line C4, by operation of the first transfer unit 251, based on the measured second spaced distance between the laser cutter 230 and the wafer 10 on the fourth cutting line C4 (S240).

Figure 13:
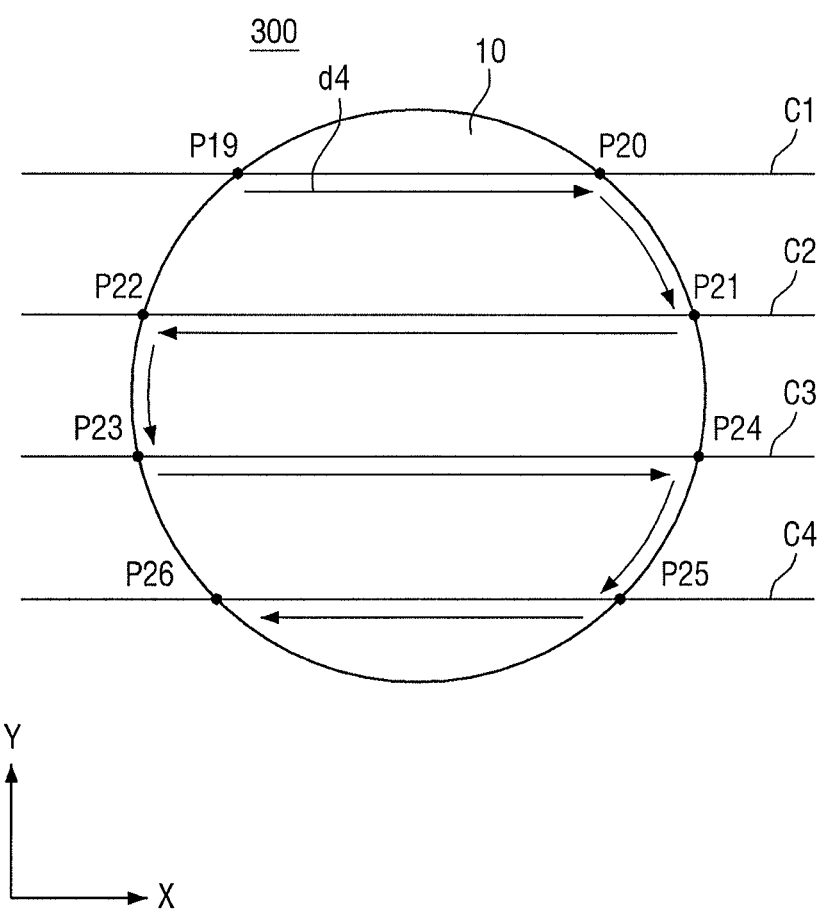
FIG. 13 illustrates another embodiment of a wafer cutting operation.

FIG. 13 illustrating another embodiment of the operation of a wafer cutting apparatus 300. Referring to FIGS. 7 and 13, unlike the wafer cutting apparatus 200, in a wafer cutting apparatus 300, a first sensor 241, a laser cutter 230, and a second sensor 242 may be moved along the respective cutting lines C1, C2, C3, and C4 located on the wafer 10 and the edges of the wafer 10.

FIG. 13 illustrates traveling routes d4 of the first sensor 241, the laser cutter 230, and the second sensor 242 when the wafer cutting apparatus 300 cuts the wafer 10. For example, the first sensor 241 and the second sensor 242 may measure the spaced distance between the laser cutter 230 and the wafer 10, between nineteenth position to twenty-sixth position (P19, P20, P21, P22, P23, P24, P25 and P26) on the edges of the wafer 10 along the respective cutting lines C1, C2, C3, and C4.

Further, the laser cutter 230 may cut the wafer 10 between the nineteenth position to the twenty-sixth position (P19, P20, P21, P22, P23, P24, P25 and P26) on the edges of the wafer 10 along the respective cutting lines C1, C2, C3, and C4.

When cutting of the wafer 10 is completed along the first cutting line C1, the first sensor 241, the laser cutter 230, and the second sensor 242 may be moved to the twenty-first position P21 from the twentieth position P20 along the edges of the wafer 10 by the first and second transport units 251 and 252.

Accordingly, the wafer cutting apparatus 300 may reduce process time of the cutting process of the wafer 10, as compared to the wafer cutting apparatus 200.

Figure 14:
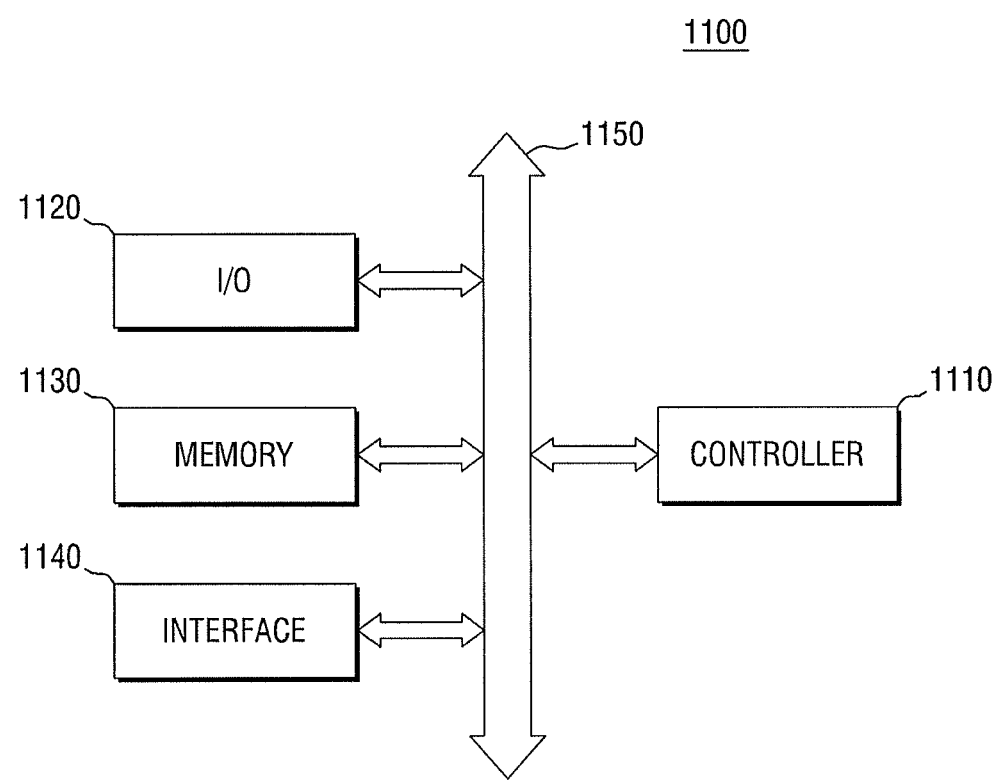
FIG. 14 illustrates an embodiment of an electronic system.

FIG. 14 illustrates an embodiment of an electronic system 1100 which includes a semiconductor device formed using any of the aforementioned embodiments of the wafer cutting apparatus.

Referring to FIG. 14, the electronic system 1100 may include a controller 1110, an input/output (I/O) device 1120, a memory device 1130, an interface 1140, and a bus 1150. The controller 1110, the I/O device 1120, the memory device 1130, and/or the interface 1140 may be coupled to one another through a bus 1150. The bus 1150 corresponds to a path through which data is transferred.

The controller 1110 may include at least one of a microprocessor, a digital signal processor, a microcontroller, or logic devices for performing functions similar to these devices.

The I/O device 1120 may include a keypad, a keyboard, a display device, and/or another type of input/output device.

The memory device 1130 may store data and/or commands.

The interface 1140 may serve to transmit data to or receive data from a communication network. The interface 1140 may be a wired or wireless interface. For example, the interface 1140 may include an antenna or a wired or wireless transceiver. Further, the electronic system 1100 may also include a high-speed DRAM or SRAM, as an operating memory for improving the operation of the controller 1110.

The semiconductor device manufactured according to any of the aforementioned embodiments may be within the memory device 1130 or may be provided as a part of the controller 1110, the I/O device 1120, and/or the like.

The electronic system 1100 may be applied to a personal digital assistant (PDA), a portable computer, a web tablet, a wireless phone, a mobile phone, a digital music player, a memory card or all types of electronic products for transmitting or receiving information in a wireless environment.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, transfer units, calculators, interpolators, extrapolators, and other processing features of the embodiments disclosed herein may be implemented in logic which, for example, may include hardware, software, or both. When implemented at least partially in hardware, the controllers, transfer units, calculators, interpolators, extrapolators, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, transfer units, calculators, interpolators, extrapolators, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A wafer cutting apparatus, comprising:
   a stage to support a wafer;
   a cutter to cut the wafer in a first direction using a beam;
   a sensor spaced being apart from the cutter in a second direction different from the first direction and being independently movable from the cutter in the second direction, the sensor to measure a spaced distance between the wafer and the cutter; and
   a third mover to move the cutter in a third direction perpendicular to the first and second directions to adjust a cutting depth of the wafer, wherein the sensor is to measure the spaced distance between the wafer and the cutter along a second cutting line parallel to a first cutting line while the cutter cuts the wafer along the first cutting line on the wafer.

2. The apparatus as claimed in claim 1, wherein the sensor is adjusted such that an interval in the second direction, perpendicular to the first direction between the cutter and the sensor, is equal to an interval between the first cutting line and the second cutting line.

3. The apparatus as claimed in claim 2, further comprising:
   a first mover to move the sensor and cutter in the first direction, and
   a second mover to move the sensor and the cutter in the second direction.

4. The apparatus as claimed in claim 3, wherein after cutting of the wafer is completed along the first cutting line:
   the second mover is to move the cutter to a first end of the second cutting line, and is to move the sensor to a first end of a third cutting line parallel to the second cutting line.

5. The apparatus as claimed in claim 1, further comprising:
   an adjuster to adjust an interval in the second direction between the sensor and the cutter, in order to adjust an interval between the first cutting line and the second cutting line.

6. The apparatus as claimed in claim 5, further comprising:
   a calculator to calculate a position of a third cutting line parallel to the second cutting line by extrapolation based on the interval between the first cutting line and the second cutting line.

7. The apparatus as claimed in claim 1, further comprising:
   a calculator to calculate a position of the second cutting line between the first cutting line and a third cutting line by interpolation based on an interval between the first cutting line and the third cutting line parallel to the first cutting line.

8. The apparatus as claimed in claim 7, wherein the calculator is to calculate positions of the second and third cutting lines based on a combination of the interpolation and extrapolation for calculating the position of the third cutting line based on the interval between the first cutting line and the second cutting line.

9. The apparatus as claimed in claim 1, wherein the cutter is moved in the third direction independently from the sensor.

10. The apparatus as claimed in claim 1, wherein the cutter is a laser cutter.

11. A wafer cutting apparatus, comprising:
   a stage to support a wafer;
   a cutter to irradiate the wafer with a beam along a first direction to cut the wafer;
   a first sensor on a first side of the cutter to measure a first spaced distance between the wafer and the cutter;
   a second sensor, on a second side opposing the first side of the cutter, to measure a second spaced distance between the wafer and the cutter; and
   a corrector to correct an offset between the first sensor and the second sensor based on a comparison of the measured first spaced distance and the measured second spaced distance, wherein
   the cutter, the first sensor, and the second sensor are disposed along the first direction, and wherein
   at least one of the first or second sensors are to operate while the cutter cuts the wafer.

12. The apparatus as claimed in claim 11, wherein after cutting of the wafer is completed along a first cutting line formed on the wafer:
   the cutter, the first sensor, and the second sensor are to be moved to one end of the wafer which includes a second cutting line parallel to the first cutting line.

13. The apparatus as claimed in claim 11, further comprising:
   a first mover to move the first and second sensors and the cutter on a plane parallel to the wafer; and
   a second mover to move the cutter in a direction perpendicular to the wafer to adjust a cutting depth of the wafer.

14. The apparatus as claimed in claim 11, wherein:
   the cutter cuts the wafer when the cutter is advanced in the first direction, while the first sensor measures the first spaced distance, and
   when the cutter is advanced in a second direction opposite to the first direction, the cutter cuts the wafer while the second sensor measures the second spaced distance.

15. The apparatus as claimed in claim 11, wherein the cutter is a laser cutter.

* * * * *